US005221425A

United States Patent [19]
Blanchard et al.

[11] Patent Number: 5,221,425
[45] Date of Patent: Jun. 22, 1993

[54] METHOD FOR REDUCING FOREIGN MATTER ON A WAFER ETCHED IN A REACTIVE ION ETCHING PROCESS

[75] Inventors: Gary W. Blanchard, Milton; Charles R. Bossi, Burlington; Edward H. Payne; Thomas W. Weeks, both of Essex Junction, all of Vt.

[73] Assignee: International Business Machines Corporation, Armonk, N.Y.

[21] Appl. No.: 748,114

[22] Filed: Aug. 21, 1991

[51] Int. Cl.⁵ ................................................ B44C 1/22
[52] U.S. Cl. ...................................... 156/643; 156/646
[58] Field of Search .......... 204/192.1, 192.32, 192.34, 204/192.37; 156/646, 643

[56] References Cited

U.S. PATENT DOCUMENTS

| | | | |
|---|---|---|---|
| 4,233,109 | 11/1980 | Nishizawa | 156/643 |
| 4,595,482 | 6/1986 | Mintz | 204/298 |
| 4,718,975 | 1/1988 | Bowling et al. | 156/643 |
| 4,761,199 | 8/1988 | Sato | 156/345 |
| 4,818,359 | 4/1989 | Jones et al. | 204/298 |
| 4,853,081 | 8/1989 | Mlynko | 156/643 |
| 4,863,561 | 9/1989 | Freeman et al. | 156/646 |
| 4,886,565 | 12/1989 | Koshiba et al. | 156/646 X |
| 4,963,238 | 10/1990 | Siefkes et al. | 204/192.12 |
| 5,091,050 | 2/1992 | Fujino et al. | 156/646 X |

*Primary Examiner*—David A. Simmons
*Assistant Examiner*—Chester T. Barry
*Attorney, Agent, or Firm*—Heslin & Rothenberg

[57] ABSTRACT

A system for reducing the concentration of foreign material on a wafer etched in a reactive ion etch chamber is disclosed. As a radio frequency voltage is applied within the etch chamber, the pressure within the etch chamber may be reduced to a base pressure. Also, the flow of gas into the etch chamber may be maintained. This may include minimizing the flow of high reactive gas into the etch chamber while maintaining the flow of low reactive gas therein. The system further includes deactivating the radio frequency voltage. Deactivating the radio frequency voltage may be accomplished by gradually reducing the voltage to a minimum voltage. The gradual reduction may be accomplished by incrementally reducing the voltage in a series of steps. If reactive ion etching occurs with magnetic enhancements, the magnetic field applied to the etch chamber may be deactivated, typically prior to the reduction of the radio frequency voltage.

11 Claims, 3 Drawing Sheets

METHOD FOR REDUCING FOREIGN MATTER ON A WAFER ETCHED IN A REACTIVE ION ETCHING PROCESS

BACKGROUND OF THE INVENTION

This invention relates to the field of reactive ion etching and, more particularly, to a method for reducing the foreign matter deposited on a wafer during reactive ion etching.

In reactive ion etching, a radio frequency and static electric field are used to energize a gas which forms a plasma. The plasma is chemically reactive with the wafer and thereby induces etching. The reactive etch chamber is evacuated prior to the introduction of reactive gases and prior to applying a radio frequency ("RF") voltage within the chamber to form the plasma. The chamber is then evacuated to a particular operating pressure, generally between five millitorr and three hundred millitorr.

Reactive ion etching may also be supplemented with a magnetic enhancement. Typically, a mixture of reactive and non-reactive gases are flowed into the chamber and the RF voltage is applied therein. The magnetic flux may be imparted into the etching chamber, typically by means of electromagnetic coils, to direct charged ions in the plasma to particular locations of the etch chamber. This technique is often used to more precisely control the etching of the wafer. Reactive ion etching, both with and without magnetic enhancement, is a process which is well known in the art.

Preventing foreign matter from being deposited on the wafer during or immediately after the etching process has been a major concern in reactive ion etching. Generally, during etching, particles generated during the process become ionized and are suspended above the wafer surface within the chamber. At the end of the etching process, when the RF voltage is deactivated, the particles fall to the wafer surface and are deposited thereon. These particles pollute the wafer surface and create defects which impair the performance of the resultant integrated circuitry. Particularly in horizontal reactive ion etch chambers, where the wafer is placed in a horizontal plane within the chamber, relatively large amounts of foreign matter can fall directly on the wafer surface after the RF voltage is deactivated.

Various techniques have been developed to reduce the foreign matter deposited on the wafer as a result of reactive ion etching. U.S. Pat. No. 4,718,975 issued Jan. 12, 1988 describes a system for reducing particle contamination at the end of the etching process. In this technique, a shield is moved above the wafer to prevent falling particles from contacting the surface of the wafer. U.S. Pat. No. 4,761,199 issued Aug. 2, 1988 discloses a method where the reactive ion etch chamber contains a separate electrode having a potential applied thereto which attracts the charged foreign matter particles. The foreign matter is electrostatically attracted to the electrode and, therefore, will not fall on the wafer surface after etching is complete.

One drawback to these particular techniques is that they require an additional apparatus which must be implemented within the etch chamber. Therefore, to reduce foreign matter, the reactive ion etch chambers must be equipped with specially designed parts. Conventional reactive ion etch chambers have not been used, without modification, in a process for minimizing foreign matter deposition.

It is therefore an object of the present invention to provide a technique for reducing the foreign matter deposited on a wafer as a result of a reactive ion etching.

It is also an object of the present invention to provide a technique for reducing the foreign matter deposited on a wafer as a result of a reactive ion etching without the need for modifying a conventional reactive ion etch apparatus.

It is also an object of the present invention to provide a technique for reducing the foreign matter on a wafer produced using a reactive ion etch without impairing the etching process.

SUMMARY OF THE INVENTION

The aforementioned objects and advantages may be achieved through implementation of the method of reducing the concentration of foreign material on a wafer etched in a reactive etch chamber in accordance with the principles of the present invention. The method includes reducing the pressure within the etch chamber to a base pressure when the wafer has been etched to a certain degree. The method may also include maintaining a flow of gas into the chamber. Maintaining a flow of gas into the chamber may comprise minimizing the flow of high reactive gas into the chamber while maintaining a flow of low reactive gas into the chamber. The method may further include deactivating a radio frequency voltage being applied within the etch chamber. Deactivating a radio frequency voltage may include gradually reducing the radio frequency voltage to a minimum voltage. Also, deactivating the radio frequency voltage may include incrementally reducing the voltage in a series of steps. The method may also include deactivating a magnetic field applied to the etch chamber. The deactivation of the magnetic field may occur after minimizing a flow of high reactive gas into the chamber while maintaining the flow of low reactive gas into the chamber. Also, the deactivation of a radio frequency voltage being applied within the etch chamber may occur after minimizing the flow of high reactive gas into the chamber while maintaining the flow of low reactive gas into the chamber. This may occur after deactivating the magnetic field applied to the etch chamber.

The invention also encompasses a method of reactive ion etching a wafer within a reactive ion etch chamber. This method includes evacuating a reactive ion etch chamber at an operating pressure, flowing gas into the etch chamber while the etch chamber is maintained at operating pressure, applying a radio frequency voltage to a cathode within the etch chamber, reducing the pressure in the etch chamber to a base pressure while the radio frequency is applied to the cathode. This method may also include flowing low reactive gas into the etch chamber while minimizing the flow of high reactive gas. Also, the method may further include deactivating the radio frequency voltage applied to the cathode. Deactivating the radio frequency voltage may include gradually reducing the radio's frequency voltage to minimum voltage. This may be achieved by incrementally reducing the voltage in a series of steps.

BRIEF DESCRIPTION OF THE DRAWINGS

The invention, together with its objects, advantages and features will be better understood through consideration of the following drawings in which.

DETAILED DESCRIPTION

Figure 1:
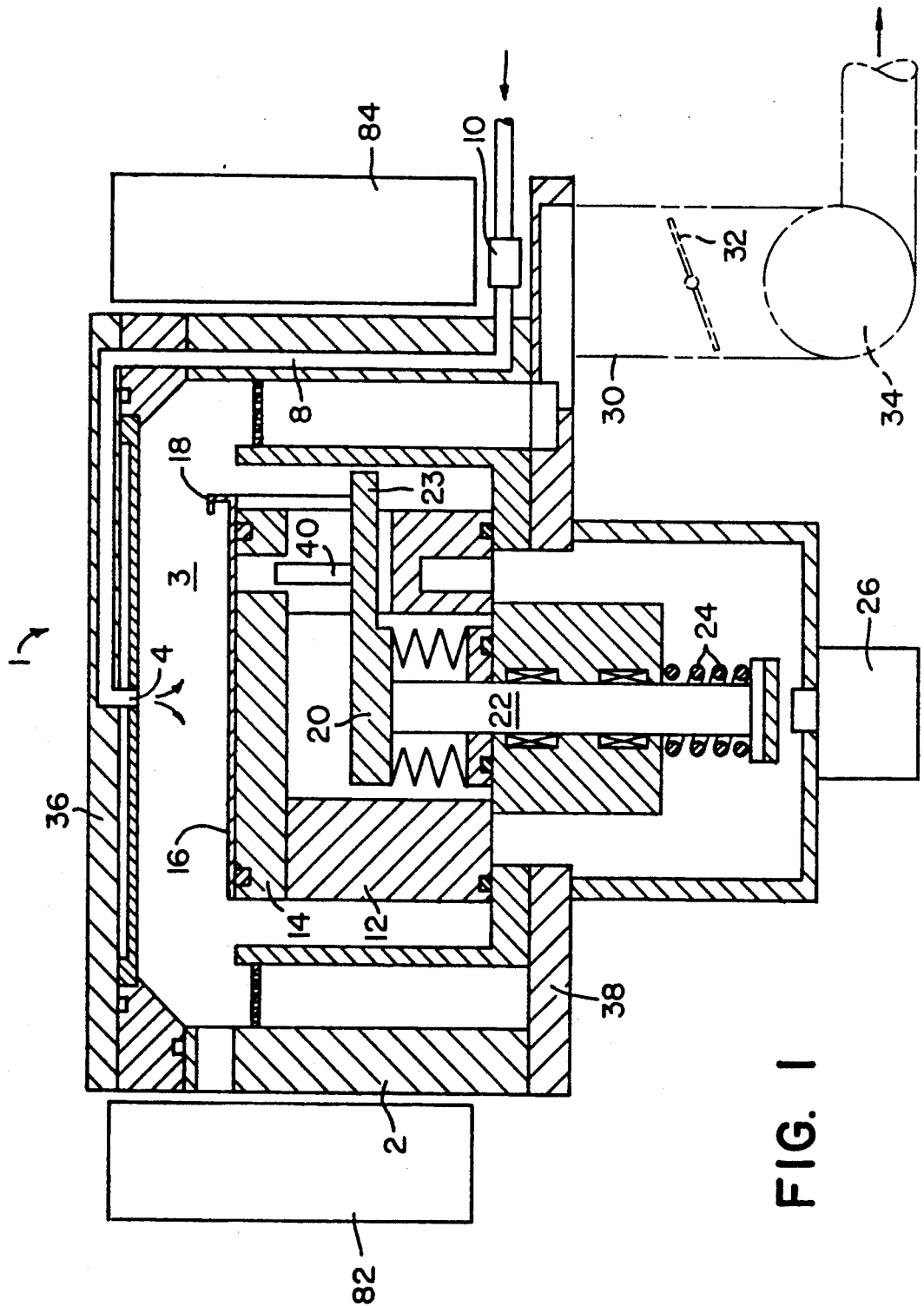
FIG. 1 is a schematic representation of a reactive ion etching apparatus capable of being used in a process for reducing foreign matter on a wafer etched therein in accordance with the principles of the present invention.

Referring to FIG. 1, the reactive ion etch apparatus, generally denoted 1, contains a housing 2, a top 36 and bottom 38 which define a reactive ion etch chamber 3. Within the chamber 3, a pedestal 14 is located atop a cathode 12. A means for introducing gas within the chamber 3 includes a gas inlet 8 in fluid flow relationship with a shower head 4 located at the top of the chamber 3. A filter 10 is connected to the gas inlet 8. Gas may flow through the gas inlet 8 and filter 10 and be dispersed by the shower head within the chamber 3. An outlet port 30 is in fluid flow relationship with the chamber 3 and a vacuum pump 34. The outlet port 30 also contains a throttle valve 32. The pump and throttle valve 32 control the pressure and flow within the chamber 3. The apparatus 1 may also contain a robotic means 23 for maintaining and altering the position of a wafer 16 within the chamber 3. The robotic means contains a clamp ring 18 which when positioned secures the wafer 16 on the pedestal 14. A lift pin 40 is connected to an arm 20. The arm 20 is controlled by a pneumatic lift cylinder 26 which translates a rotatable shaft 22 connected to the arm 20. The lift cylinder 26 and shaft 22 allow the wafer 16 to be raised and rotated into, and out of, the etch chamber.

The apparatus is used for reactive ion etching of wafers which are typically used for the production of integrated circuitry. As is well known in the art, wafers generally comprised of silicon, silicon oxide, and silicon nitride are used as materials which are reactive ion etched. To perform ion etching, the wafer 16 is positioned on the pedestal 14 by the robotic means 23. The chamber 3 is then evacuated to an operating pressure, which is typically between 5 and 300 millitorr, depending upon the type of material being etched and the particular etching system used. The evacuation of the chamber 3 is controlled by the vacuum pump 34 and throttle valve 32.

Gases are then introduced by a gas source (not shown) into the gas inlet port 8 and are disbursed by the shower head 4 into the etch chamber 3. Normally, both reactive and non-reactive gases are introduced into the chamber 3. Typical reactive gases include, but are not limited to, $NF_3$, $CF_4$, $Cl_2$, HBr, and $BCl_3$, and others which are well known in the art. Typical non-reactive gases include, but are not limited to helium, argon, helium or argon/oxygen mixtures, and other equivalents, which are also well known in the art.

The gas flow rate within the chamber 3 is stabilized by control of the throttle valve 32 and vacuum pump 34. An RF voltage is applied within the chamber between the cathode 12 and the anode which comprises the shower head 4, housing top 36, and/or side wall 2. A typical RF voltage generates between 50 and 1800 watts of power, depending upon the particular etching apparatus and process. The etching occurs physically when the RF voltage is activated such that the gas within the chamber 3 becomes energized into a plasma. The reactive gases form a plasma which physically interacts and chemically reacts with the wafer surface. As a result, the wafer is etched.

As is well known in the art, a magnetic field may be applied to the etch chamber 3 to enhance etching. However, the use of magnetic enhancements is optional in reactive ion etching. Generally, etch apparatus equipped with magnetic enhancements include electromagnetic coils 82, 84 which create a magnetic field within the chamber 3 which affects the direction of the plasma therein. A typical magnetic flux for reactive ion etching measures approximately 300 gauss. However, flux values of patterns may vary depending upon the particular etching apparatus used, and process performed.

Reactive ion etching processes and various reactive ion etching apparatus, both with and without magnetic enhancement features, are well known in the art. Using these conventional reactive ion etching systems, the amount of foreign matter which may be deposited on the wafer surface as a result of the etching process may be substantially minimized by operation of the systems in accordance with the principles of the present invention.

To minimize the foreign material deposited on the wafer, while the RF voltage is activated and when the wafer has been etched to a certain degree by the plasma, the pressure within the chamber may be brought to a base pressure (i.e., a pressure which will effectively evacuate the chamber 3, typically about 3 millitorr). The degree of etching is determined by the type of etch desired. The flow of reactive gas into the chamber may then be ceased while the pressure within the chamber is maintained at base pressure. However, the flow of the less reactive gases within the chamber may continue. At this time, reactive gases, which were energized into the plasma to etch the wafer begin to evacuate the chamber 3. Moreover, foreign matter, generally constituting charged particles suspended above the wafer surface, also evacuate the chamber 3. If the etching has occurred with magnetic enhancement, the magnetic field may be deactivated such that there is no magnetic flux within the chamber 3. The RF voltage may then be decreased and deactivated, while the chamber 3 is maintained at base pressure.

It has been found that gradually reducing the RF voltage to zero results in the least amount of foreign matter deposited on the wafer. Moreover, gradually reducing the RF voltage may be accomplished by incrementally reducing the power in a series of steps. This may be accomplished by reducing the power to a lower level for a predetermined period of time, thereafter again reducing the power to an even lower level for an additional period of time, and thereafter repeating incremental power reduction.

After the RF voltage has been reduced to zero, the chamber 3 may then be isolated from the outlet port 30, typically by closing an isolation valve (not shown). A non reactive gas, such as nitrogen or the like, is then flooded into the chamber to allow the pressure to increase to a point where the wafer 16 may be transferred from the chamber 3 and replaced.

Using an Applied Material's 5000 etch tool, the amount of foreign matter deposited on a wafer was compared to the amount of foreign matter typically deposited on a wafer without performing the etching process in accordance with the principles of the present invention.

Figure 2:
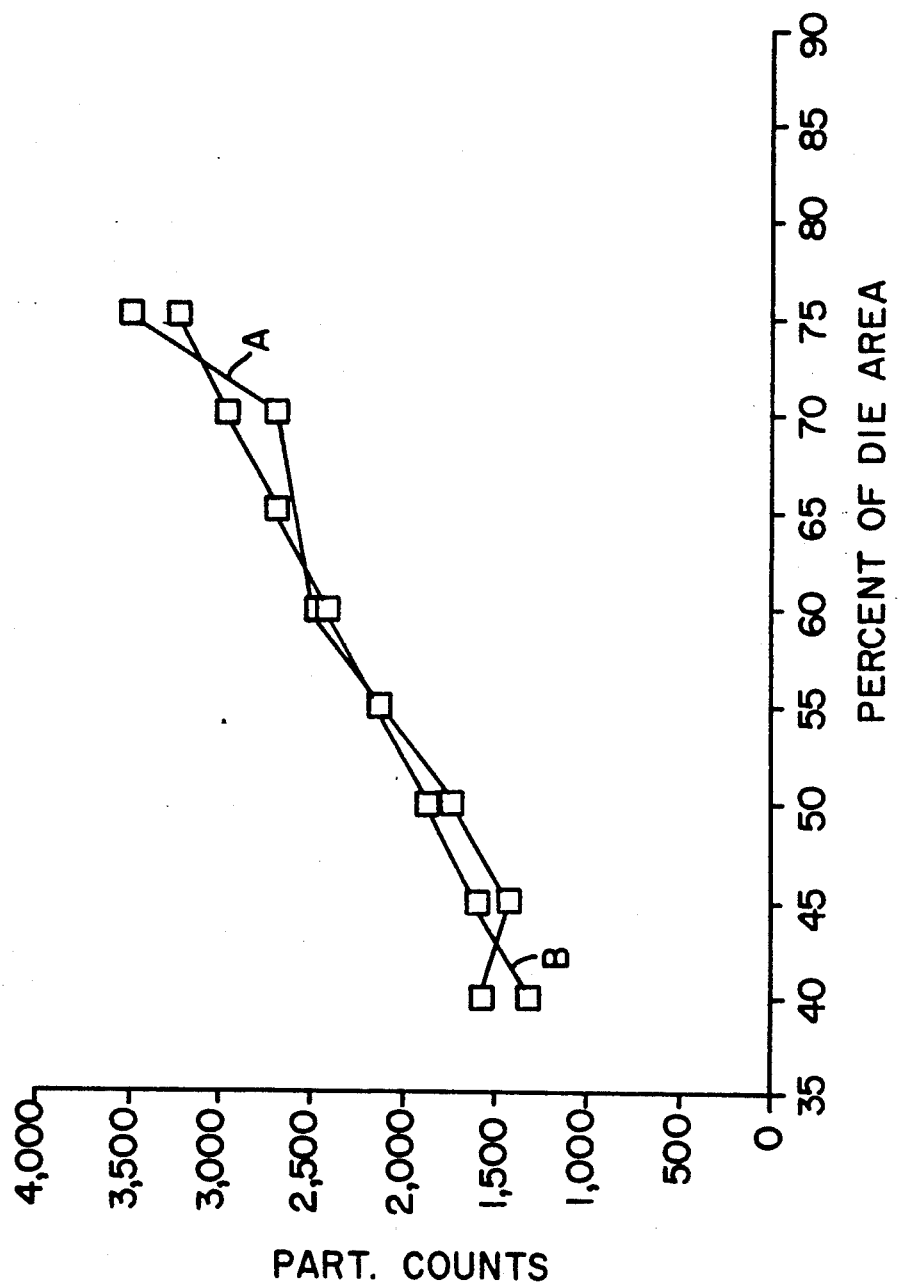
FIG. 2 depicts a graphical representation of the foreign matter particles counted on a wafer as a function of the percentage of the wafer area which has been measured after etching of the wafers using a conventional reactive ion etch technique without incorporating the principles of the present invention.

FIG. 2 depicts a graphical representation of the measurement of the particle counts versus the percentage of the die (wafer area) measured after etching a wafer using a conventional etching process on conventional apparatus with magnetic enhancement and without incorporating the principles of the present invention. The etching was performed in an Applied Materials 5000 etching apparatus and foreign matter particles were measured thereafter using a Tencor measurement tool, in a manner well known in the art. Particle counts between 40 and 75 percent of the die area at 5 percent increments were measured and are shown in the graph of FIG. 2. After measurement of 75% of the area of the wafer surface, approximately 3500 particles were counted using the Tencor 7000 measurement tool. Curve A represents the actual values of the particles measured. Curve B represents the nearest linear relationship which corresponds to Curve A. Therefore, Curve B may be extrapolated to determine that 100% of the wafer would contain about 4500 particles.

Also using an Applied Materials 5000 etching apparatus and Tencor 7000 measurement tool, the foreign matter particles on a wafer were measured both prior to etching and after etching using the principles of the present invention. Five lots of wafers were tested, each lot containing 25 wafers therein. Results of the tests are graphically illustrated in FIG. 3. The points plotted on the graph of FIG. 3 represent the foreign matter particles counted on one particular wafer in each of the five product lots.

The test was conducted with magnetic enhancement for each of the wafers. Initially, the etch chamber was evacuated to an operating pressure between approximately 5 and 300 millitorr. Reactive gases were then flowed into the chamber. Non-reactive gases were also introduced into the chamber and the flow rate of the combination of reactive and non-reactive gases was stabilized to a point where the etch chamber operating pressure was maintained. The gas flow rate and pressure were stabilized by manipulating the throttle valve and vacuum pump. A radio frequency voltage, generating approximately 800 watts power, was then applied within the chamber. At this point etching occurred. After the etch was complete, the pressure within the chamber was reduced to a base pressure of approximately 3 millitorr and the magnetic enhancement was deactivated. The flow of the most reactive gases into the chamber was then ceased while the flow rate of the least reactive gases was continued and the pressure within the etch chamber was maintained at a base pressure of approximately 3 millitorr. The RF voltage was then gradually decreased to zero. The RF power was decreased to 500 watts for 15 seconds. Thereafter, the power was reduced to 350 watts for a subsequent 15 seconds; reduced to 200 watts for another 15 seconds; and reduced to 50 watts for approximately 30 seconds thereafter. Finally the power was reduced to zero.

Figure 3:
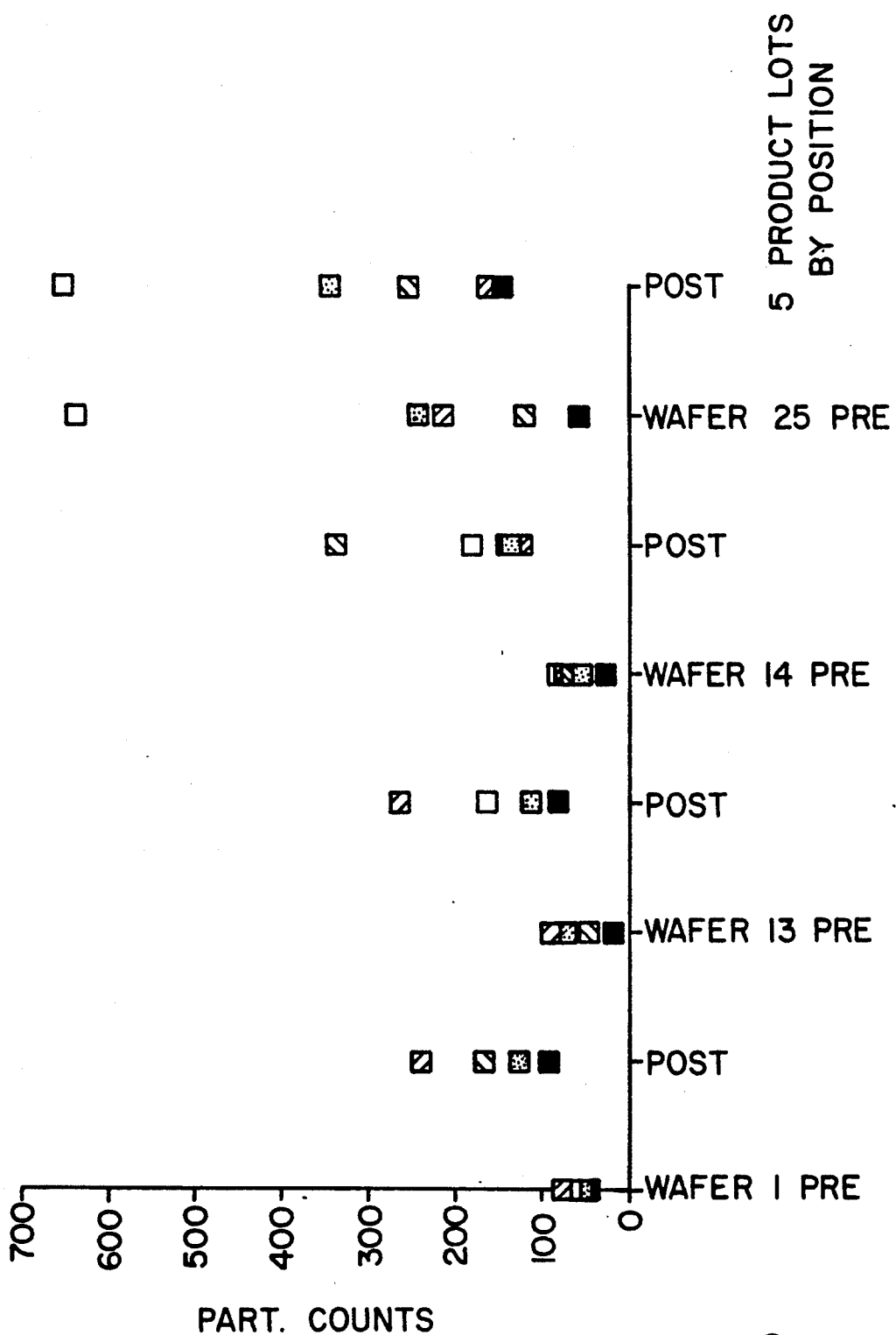
FIG. 3 depicts a graphical representation of foreign matter particle counts for certain wafers which were grouped in five lots of twenty-five wafers per lot and tested for particle counts after etching in accordance with the principles of the present invention.

The horizontal axis of the graph depicted in FIG. 3 is divided into sections corresponding to the first, thirteenth, fourteenth, and twenty-fifth wafers in each of five individual product lots which contain 25 wafers per lot. Each group of five points, located in each section of the graph, represent the five wafers from each individual lot. On certain of the wafer counts, the amounts of particles are similar such that the points may be superimposed upon one another. e.g. wafer 1 (post) points 102 and 103. The points on the graph are located at the position of the vertical axis corresponding to the number of the particles on the wafer. The value was obtained by measurement on a Tencor 7000 measurement tool as before and measurement at 75% of the wafer surface was extrapolated using a curve derived as in FIG. 2 to a value at 100%. Wafers from the first lot are represented by the solid box 101, the second lot by the stippled box 102, the third lot by the open box 103, the fourth lot by the ascending diagonal striped box 104, and the fifth lot by the descending diagonal striped box 105. Each of the wafers was tested and measured for particle counts both prior to etching and after etching in accordance with the principles of the present invention. The wafers, in their lots, which were measured prior to processing are located at the horizontal axis positions designated by "PRE". The wafers measured after processing are located at the horizontal axis positions designated by "POST".

As represented in FIG. 3, the first, thirteenth and fourteenth wafers for each of the five lots each contained less than 100 particles thereon prior to processing. However, the measurements of the particle counts for these numbered wafers in each lot, after processing in accordance with the principles of the present invention, yielded particle counts between 75 and 350. The particle counts for the twenty-fifth wafer in each lot were slightly higher, but still below 700. However, the particle concentration on these wafers prior to processing was correspondingly higher, therefore, the amount of additional particles actually deposited on the wafer as a result of the etching process was similar to that deposited on the first, thirteenth and fourteenth wafers of each of the five lots.

FIGS. 2 and 3 indicate that the amounts of particles deposited on a wafer during reactive ion etching can be substantially minimized by modifying the etching process in accordance with the principles of the present invention. Although the tests were conducted without magnetic enhancements, the invention has reduced particle counts on a wafer regardless of whether or not the etching process is supplemented with magnetic enhancement.

Modifications to the deactivation of the RF voltage may be implemented to optimize the particulate count depending upon the type of wafer etched and the type of reactive gas used to generate the etching plasma. For example, in etching a silicon wafer, it has been found that a gradual reduction in the RF voltage, as performed, supra, provide optimum results. However, in the etching of a silicon oxide wafer, it has been found that a sharper reduction in the RF voltage, as a function of time, provides improved results.

Although the invention has been described and as applied with an Applied Material 5000 etching apparatus, it is apparent to one skilled in the art that the invention may be used with batch wafer systems and/or other reactive ion etch systems.

Although the invention has been described in conjunction with the embodiments described herein, it will be apparent to one skilled in the art that various modifications and substitutions may be made without departing, in any way, from the spirit of the invention. Any such modifications are intended to be within the scope of the invention as defined by the following claims.

I claim:

1. A method of reducing the concentration of foreign material on a wafer etched in a reactive ion etch chamber by transmitting radio frequency voltage within the etch chamber and flowing gas therein, the method comprising:

in the presence of a radio frequency voltage, reducing the pressure within the etch chamber to a base pressure while maintaining a flow of low reactive gas into the chamber and minimizing a flow of high reactive gas into the chamber after the wafer has been etched to a certain degree.

2. The method of claim 1 further comprising subsequently deactivating a radio frequency voltage being applied to a cathode within the etch chamber.

3. The method of claim 2 wherein the step of deactivating a radio frequency voltage comprises gradually reducing the radio frequency voltage to a minimum voltage.

4. The method of claim 3 wherein the step of deactivating the radio frequency voltage comprises incrementally reducing the voltage in a series of steps.

5. The method of claim 3 further comprising deactivating a magnetic field applied to the etch chamber.

6. A method of reducing the concentration of foreign material on a wafer etched in a reactive ion etch chamber by transmitting a radio frequency voltage within the etch chamber and flowing gas therein, the method comprising:

reducing the pressure within the etch chamber to a base pressure;

minimizing a flow of high reactive gas into the chamber while maintaining a flow of low reactive gas into the chamber;

thereafter, deactivating a radio frequency voltage applied to a cathode within the etch chamber by gradually reducing the voltage to a minimum voltage.

7. The method of claim 6 further comprising deactivating a magnetic field applied to the etch chamber after minimizing the flow of high reactive gas in the chamber while maintaining the flow of low reactive gas into the chamber.

8. A method of reactive ion etching a wafer within a reactive ion etch chamber comprising:

evacuating the reactive ion etch chamber to an operating pressure;

flowing gas into the etch chamber while the etch chamber is maintained at said operating pressure;

applying a radio frequency voltage to a cathode within the etch chamber;

reducing the pressure in the etch chamber to a base pressure while the radio frequency voltage is applied to the cathode; and maintaining the etch chamber at said base pressure and flowing low reactive gas into the etch chamber while minimizing the flow of high reactive gas therein.

9. The method of claim 8 further comprising subsequently deactivating the radio frequency voltage applied to the cathode.

10. The method of claim 9 wherein deactivating the radio frequency voltage comprises gradually reducing the radio frequency voltage to a minimum voltage.

11. The method of claim 10 wherein deactivating the radio frequency comprises incrementally reducing the voltage in a series of steps.

* * * * *